United States Patent
Ding et al.

(10) Patent No.: US 7,572,878 B2
(45) Date of Patent: Aug. 11, 2009

(54) POLYCYCLIC POLYIMIDES AND COMPOSITIONS AND METHODS RELATING THERETO

(75) Inventors: Jiang Ding, Wilmington, DE (US); Christian Peter Lenges, Wilmington, DE (US); Christopher Dennis Simone, Pickerington, OH (US); Brian C. Auman, Pickerington, OH (US)

(73) Assignee: E. I. Du Pont de Nemours and Company, Wilmington, DE (US)

( * ) Notice: Subject to any disclaimer, the term of this patent is extended or adjusted under 35 U.S.C. 154(b) by 588 days.

(21) Appl. No.: 11/229,110

(22) Filed: Sep. 16, 2005

(65) Prior Publication Data

US 2007/0066734 A1    Mar. 22, 2007

(51) Int. Cl.
    *C08G 73/10*    (2006.01)
(52) U.S. Cl. .................. 528/340; 528/335; 528/338; 528/342; 528/344; 528/350

(58) Field of Classification Search ............... 528/335, 528/338, 340, 342, 344, 350
See application file for complete search history.

(56) References Cited

U.S. PATENT DOCUMENTS

| 4,851,505 A | 7/1989 | Hayes |
| 4,912,197 A | 3/1990 | Hayes |
| 5,286,841 A | 2/1994 | Auman et al. |
| 6,710,160 B2 | 3/2004 | Yamashita et al. |
| 6,734,276 B2 | 5/2004 | Yamashita et al. |
| 6,812,065 B1 | 11/2004 | Kitamura |

FOREIGN PATENT DOCUMENTS

| WO | WO 98/29471 | 7/1998 |
| WO | WO 02/10253 | 2/2002 |

*Primary Examiner*—Ana L Woodward

(57) ABSTRACT

The present invention is directed to the use polycyclic diamines. These diamines, when polymerized with dianhydrides, and optionally other non-polycyclic diamines are used to form new polyamic acids. The polyamic acids can be imidized to form a new class of useful polyimide resins and polyimide films, particularly in electronics type applications.

2 Claims, No Drawings

POLYCYCLIC POLYIMIDES AND COMPOSITIONS AND METHODS RELATING THERETO

BACKGROUND OF THE INVENTION

1. Field of the Invention

The present invention relates generally to polycyclic polyimides, including methods and compositions relating thereto. More specifically, the compositions and methods of the present invention are derived from cycloaliphatic diamine isomers to provide polycyclic polyimides having advantageous properties, particularly as a substitute for glass in certain electronics applications.

2. Background of the Invention

A need exists for a commercially viable glass or quartz substitute for display screens or other similar-type optical communication applications. Conventional polyimides are generally not well suited for such a use.

U.S. Pat. Nos. 6,710,160; 6,734,276 and 6,812,065 (to Mitsui Chemicals Inc.) describe a diamine mixture of 2,5-NBDA and 2,6-NBDA. However, such diamines are not well suited to provide a polyimide having a glass transition temperature, light transmissability, and coefficient of thermal expansion ("CTE"), sufficient to be a suitable replacement for quartz or glass in optical display devices or the like.

SUMMARY OF THE INVENTION

Polyimides of the present invention can be represented by the following formula:

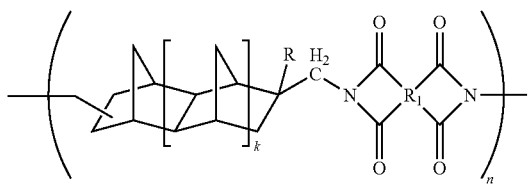

where R is $-CH_3$, $-CH_2-CH_3$, $-CH_2-CH_2-CH_3$, $-(CH_2)_3-CH_3$, $-(CH_2)_4-CH_3$, $-CX_3$, $-CH_2-CX_3$, $-CH_2-CH_2-CX_3$, $-(CH_2)_3-CX_3$, $-(CH_2)_4-CX_3$ (where X is equal to F, Cl, or Br), $-C_6H_5$ (a 6-member aromatic ring) and $C_6H_5-CH_3$ (where the methyl group is in the ortho or para position on a 6-member aromatic ring), where $R_1$, is a tetravalent group having from 4 to 27 carbon atoms and is selected from a group comprising an aliphatic group, a monocyclic aliphatic group, a condensed polycyclic aliphatic group, a monocyclic aromatic group, a polycyclic aromatic group, a substituted aliphatic or aromatic group (e.g., fluorine), a condensed aromatic group and/or an non-condensed polycyclic aliphatic group or an aromatic group in which the cyclic aliphatic group or aromatic group is connected to each other directly or via a bridging group, (or mixtures of any of these), where k is an integer represented by any of the following numbers, 0, 1 and 2, and where n is an integer ranging between and including any two of the following numbers, 10, 100, 1000, 10,000 and 100,000.

The present invention also includes polyamic acid precursors to the above polyimides and also includes processes for converting such polyamic acids into such polyimides. The polycyclic polyimides of the present invention can be embodied in a polyimide resin, a polyimide varnish or coating, and/or a polyimide film.

The polyimide (or polyamic acid precursor thereto) can be derived from the reaction product of a diamine component and dianhydride component, the diamine component can comprise (at least in part) a diamine monomer represented by the following general formula (I):

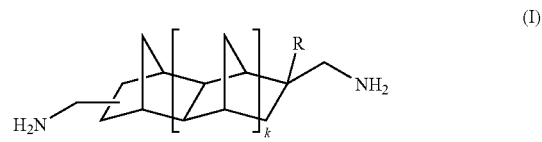

where R is $-CH_3$, $-CH_2-CH_3$, $-CH_2-CH_2-CH_3$, $-(CH_2)_3-CH_3$, $-(CH_2)_4-CH_3$, $-CX_3$, $-CH_2-CX_3$, $-CH_2-CH_2-CX_3$, $-(CH_2)_3-CX_3$, $-(CH_2)_4-CX_3$ (where X is equal to F, Cl, or Br), $-C_6H_5$ (a 6-member aromatic ring) and $C_6H_5-CH_3$ (where the methyl group is in the ortho or para position on a 6-member aromatic ring), and where k is an integer and can be equal to 0, 1 or 2.

In one embodiment, the diamine component comprises (at least in part) a diamine monomer represented by the general formula (II) below,

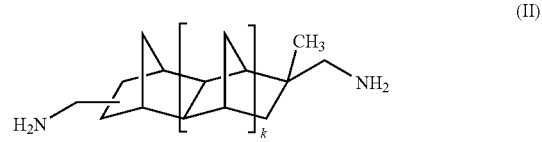

In these diamines however, the $-CH_3$ group (i.e., the lone pendant methyl group) is connected to at least one of the carbon atoms that is attached to at least one of the $-CH_2NH_2$ groups shown. For these diamines, k is an integer and can be equal to 0, 1 or 2.

The diamine of formula (I) above is present in the polyimides of the present invention either alone (i.e., as the sole diamine of the total diamine component) or in combination with other diamines (provided that the diamine is present in sufficiently high enough quantities to show an advantageous property). In addition, the diamine above can be found (and is typically used) to have a variety of different isomers and structural configurations. For example, the diamine of formula (I) can have an orientation where the $-CH_2NH_2$ groups and the R group to the norbornane scaffold can vary in position. In these diamines however, the R group is connected to at least one of the carbon atoms that is attached to at least one of the $-CH_2NH_2$ groups shown.

In one embodiment of the present invention, the diamine ($-CH_2-$) bridging of the k repeat unit (i.e., when k is equal to 1 or 2) may be on the same side or may be on the opposite side with respect to the other bridging $-CH_2-$ group(s).

In another embodiment of this invention, the polycyclic polyimide is prepared by a process comprising the combining of the diamine of formula (I) with a tetracarboxylic dianhydride. The reaction product of this diamine with one or more dianhydrides is believed to be represented, at least approximately or in part, by general formula (III) below,

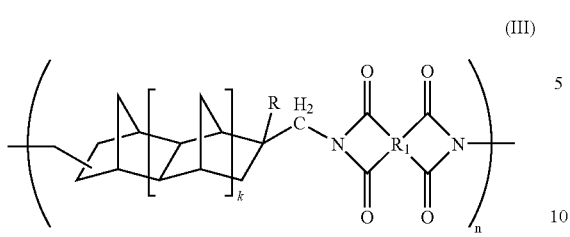

(III)

where $R_1$ can be any $C_4$ to $C_{27}$ carbon structure selected from a group comprising an aliphatic group, a monocyclic aliphatic group, a condensed polycyclic aliphatic group, a monocyclic aromatic group, a polycyclic aromatic group, a substituted aliphatic or aromatic group (e.g., fluorine), a condensed aromatic group and/or an non-condensed polycyclic aliphatic group or an aromatic group in which the cyclic aliphatic group or aromatic group is connected to each other directly or via a bridging group (or mixtures of any of these) and where n is an integer ranging between any two of the following numbers, 10, 100, 1000, 10,000 and 100,000.

In the polyimides (and polyamic precursor materials) of the present invention, the diamine of formula (II) can generally exist in at least 8 different isomeric structures (shown here if k is equal to 0, but also disclosed herein if k equals 1 or 2). These isomeric structures can be represented by at least the following formulas:

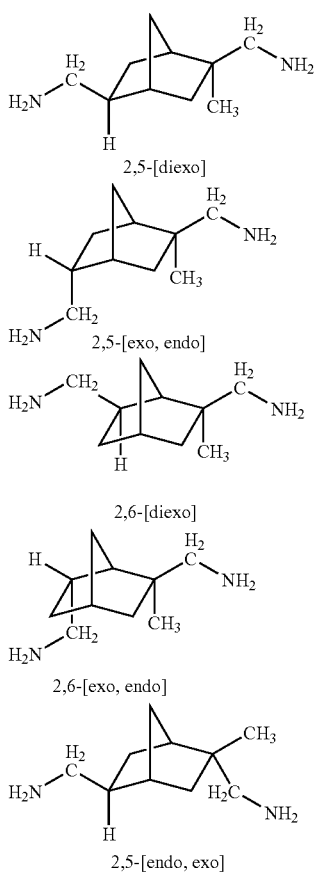

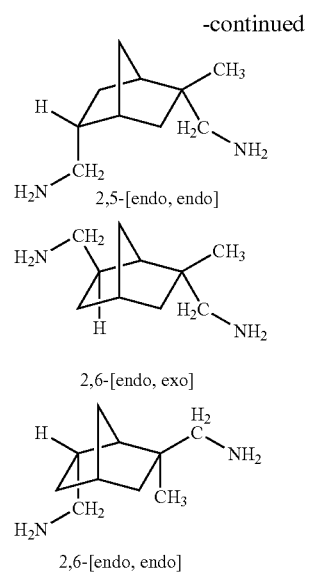

In yet another embodiment, a polycyclic polyimide of the present invention is created by a process, comprising the steps of combining the diamine of formula (I), with one or more tetracarboxylic dianhydrides, optionally with another diamine represented by the following:

$$NH_2-X-NH_2 \qquad (IV)$$

where X can represent a divalent cycloaliphatic group, a divalent aliphatic group (except the divalent group described in formula (I)), a divalent aromatic group, a substituted aliphatic or aromatic group (e.g., fluorine) or a divalent siloxane containing group.

DETAILED DESCRIPTION OF THE PREFERRED EMBODIMENT(S)

In one embodiment, the present invention is directed to polyimides, and polyamic acid solutions, derived from a diamine represented by formula (I) below,

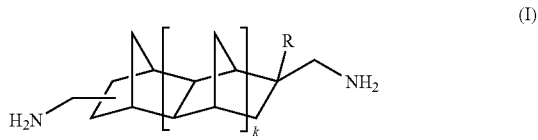

(I)

where R is $-CH_3$, $-CH_2-CH_3$, $-CH_2-CH_2-CH_3$, $-(CH_2)_3-CH_3$, $-(CH_2)_4-CH_3$, $-CX_3$, $-CH_2-CX_3$, $-CH_2-CH_2-CX_3$, $-(CH_2)_3-CX_3$, $-(CH_2)_4-CX_3$ (where X is equal to F, Cl, or Br), $-C_6H_5$ (a 6-member aromatic ring) and $C_6H_5-CH_3$ (where the methyl group is in the ortho or para position on a 6-member aromatic ring), and where k is an integer and can be equal to 0, 1 or 2.

Diamines useful in accordance with the present invention include diamine monomers represented by the general formula (II) below,

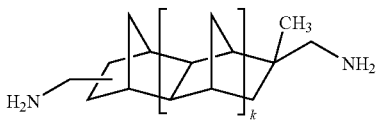

(II)

In these diamines, the —CH₃ group (i.e., the lone pendant methyl group) is connected to at least one of the carbon atoms that is attached to at least one of the —CH₂NH₂ groups shown. For these diamines, k is an integer and can be equal to 0, 1 or 2.

The diamine of formula (I) can be polymerized with a dianhydride component to form a polyamic acid and can be thermally cured, via a polycondensation reaction, to form a polyimide represented by formula (III) below,

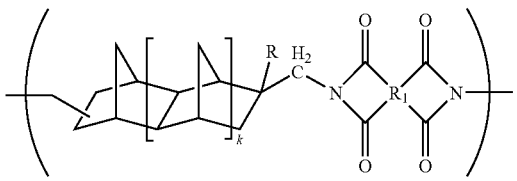

(III)

where $R_1$ can be any C4 to $C_{27}$ carbon structure selected from a group comprising an aliphatic group, a monocyclic aliphatic group, a condensed polycyclic aliphatic group, a monocyclic aromatic group, a polycyclic aromatic group, a substituted aliphatic or aromatic group (e.g., fluorine substituted), a condensed aromatic group and/or an non-condensed polycyclic aliphatic group or an aromatic group in which the cyclic aliphatic group or aromatic group is connected to each other directly or via a bridging group (or mixtures of any of these), and where n is an integer ranging between (and including) any two of the following numbers, 10, 100, 1000, 10,000 and 100,000.

One example of the diamine of formula (I) can also be expressed (more specifically) by the following formula (IV) below,

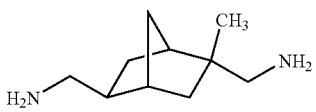

(IV)

In formula (IV) above, the diamine (under IUPAC nomenclature rules) can be described as [5-(aminomethyl)-5-methyl-bicyclo[2.2.1]heptan-2-yl]methylamine.

Another example of the diamine of formula (I) can also be expressed by the following formula (V) below,

(V)

In formula (V) above, the diamine (under IUPAC nomenclature rules) can be expressed as [6-(aminomethyl)-6-methyl-bicyclo[2.2.1]heptan-2-yl]methylamine.

In some instances, when one example of the diamine of formula (I) is synthesized or manufactured, the diamine product produced from that synthesis (or from that manufacture) is a combination of [5-(aminomethyl)-5-methylbicyclo[2.2.1]heptan-2-yl]methylamine and [6-(aminomethyl)-6-methyl-bicyclo[2.2.1]heptan-2-yl]methylamine. As such, this combination of diamines (represented as a combination of the diamines represented by formulas (IV) and (V)) can be called, for purposes of the present invention, 2,5-(or 6)-bis(aminomethyl)-2-methyl-bicyclo[2.2.1]heptane.

In the polyimides (and polyamic precursor materials) of the present invention, the diamine of formula (II) can exist in at least 8 different isomeric structures (shown here if k is equal to 0, but also disclosed herein if k equals 1 or 2). These isomeric structures can be represented by the following formulas,

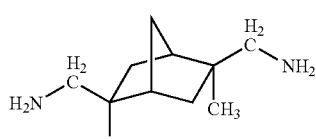

2,5-[diexo]

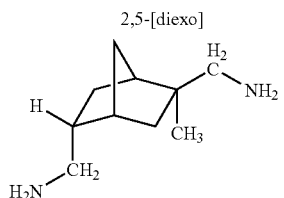

2,5-[exo, endo]

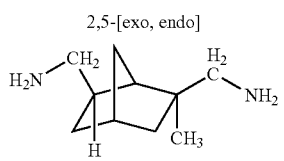

2,6-[diexo]

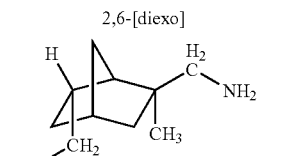

2,6-[exo, endo]

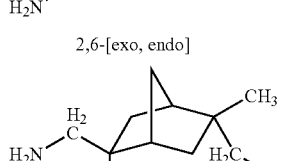

2,5-[endo, exo]

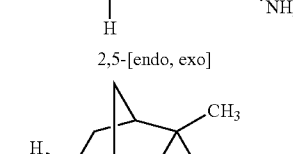

2,5-[endo, endo]

-continued

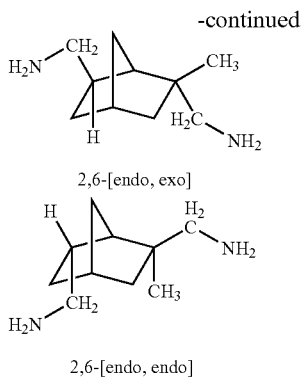

2,6-[endo, exo]

2,6-[endo, endo]

In one embodiment of the present invention, a polyimide is formed using a diamine in accordance with formula (I) in combination with one or more other diamines represented by the following:

$$NH_2-X-NH_2 \qquad (IV)$$

where X can represent a divalent cycloaliphatic group, a divalent aliphatic group (except the divalent group described in formula (I)), a divalent aromatic group, a substituted aliphatic or aromatic group (e.g., fluorine) or a divalent siloxane containing group in combination with a tetracarboxylic dianhydride. The substituted diamine can be present in the diamine component in an amount ranging between and including any two of the following numbers, 2, 3, 4, 5, 10, 15, 20, 25, 30, 35, 40, 45, 50, 55, 60, 65, 70, 75, 80, 85, 90, 95 and 99 mole percent of the total diamine component. In one embodiment of the present invention, the diamine of formula (I) is used in an amount ranging from 3 to 50 mole % of the total diamine component.

Useful diamines include, but are not limited to,
1. trans-1,4-diaminocyclohexane;
2. diaminocyclooctane;
3. tetramethylenediamine;
4. hexamethylenediamine;
5. octamethylenediamine;
6. nonamethylenediamine;
7. decamethylenediamine;
8. dodecamethylenediamine;
9. aminomethylcyclooctylmethanamine;
10. aminomethylcyclododecylmethanamine;
11. aminomethylcyclohexylmethanamine;
12. 4,4'-diaminodiphenyl methane;
13. 4,4'-diaminodiphenyl sulfide (4,4'-DDS);
14. 3,3'-diaminodiphenyl sulfone (3,3'-DDS);
15. 4,4'-diaminodiphenyl sulfone;
16. 4,4'-diaminodiphenyl ether (4,4'-ODA);
17. 3,4'-diaminodiphenyl ether (3,4'-ODA);
18. 1,3-bis-(4-aminophenoxy)benzene (APB-134);
19. 1,3-bis-(3-aminophenoxy)benzene (APB-133);
20. 1,2-bis-(4-aminophenoxy)benzene;
21. 1,2-bis-(3-aminophenoxy)benzene;
22. 1,4-bis-(4-aminophenoxy)benzene (APB-144);
23. 1,4-bis-(3-aminophenoxy)benzene;
24. 1,5-diaminonaphthalene;
25. 1,8-diaminonaphthalene;
26. 2,2'-bis(trifluoromethyl)benzidine (TFMB);
27. 4,4'-diaminodiphenyldiethylsilane;
28. 4,4'-diaminodiphenylsilane;
29. 4,4'-diaminodiphenyl-N-methyl amine;
30. 4,4'-diaminodiphenyl-N-phenyl amine;
31. 1,2-diaminobenzene (OPD);
32. 1,3-diaminobenzene (MPD);
33. 1,4-diaminobenzene (PPD);
34. 2,5-dimethyl-1,4-diaminobenzene;
35. 2-(trifluoromethyl)-1,4-phenylenediamine;
36. 5-(trifluoromethyl)-1,3-phenylenediamine;
37. 2,2-Bis[4-(4-aminopnenoxy)phenyl]-hexafluoropropane;
38. 2,2-bis(3-aminophenyl)1,1,1,3,3,3-hexafluoropropane;
39. benzidine;
40. 4,4'-diaminobenzophenone;
41. 3,4'-diaminobenzophenone;
42. 3,3'-diaminobenzophenone;
43. m-xylylene diamine;
44. bisaminophenoxyphenylsulfone;
45. 4,4'-isopropylidenedianiline;
46. N,N-bis-(4-aminophenyl)methylamine;
47. N,N-bis-(4-aminophenyl)aniline;
48. 3,3'-dimethyl-4,4'-diaminobiphenyl;
49. 4-aminophenyl-3-aminobenzoate;
50. 2,4-diaminotoluene;
51. 2,5-diaminotoluene;
52. 2,6-diaminotoluene;
53. 2,4-diamine-5-chlorotoluene;
54. 2,4-diamine-6-chlorotoluene;
55. 4-chloro-1,2-phenylenediamine;
56. 4-chloro-1,3-phenylenediamine;
57. 2,4-bis-(beta-amino-t-butyl)toluene;
58. bis-(p-beta-amino-t-butyl phenyl)ether;
59. p-bis-2-(2-methyl-4-aminopentyl)benzene;
60. 1-(4-aminophenoxy)-3-(3-aminophenoxy)benzene;
61. 1-(4-aminophenoxy)-4-(3-aminophenoxy)benzene;
62. 2,2-bis-[4-(4-aminophenoxy)phenyl]propane (BAPP);
63. bis-[4-(4-aminophenoxy)phenyl]sulfone (BAPS);
64. 2,2-bis[4-(3-aminophenoxy)phenyl]sulfone (m-BAPS);
65. 4,4'-bis-(aminophenoxy)biphenyl (BAPB);
66. bis(4-[4-aminophenoxy]phenyl)ether (BAPE);
67. 2,2'-bis-(4-aminophenyl)-hexafluoropropane (6F diamine);
68. 2,2'-bis-(4-phenoxy aniline)isopropylidene;
69. 2,4,6-trimethyl-1,3-diaminobenzene;
70. 4,4'-diamino-2,2'-trifluoromethyl diphenyloxide;
71. 3,3'-diamino-5,5'-trifluoromethyl diphenyloxide;
72. 4,4'-trifluoromethyl-2,2'-diaminobiphenyl;
73. 4,4'-oxy-bis-[(2-trifluoromethyl)benzene amine];
74. 4,4'-oxy-bis-[(3-trifluoromethyl)benzene amine];
75. 4,4'-thio-bis-[(2-trifluoromethyl)benzene-amine];
76. 4,4'-thiobis-[(3-trifluoromethyl)benzene amine];
77. 4,4'-sulfoxyl-bis-[(2-trifluoromethyl)benzene amine;
78. 4,4'-sulfoxyl-bis-[(3-trifluoromethyl)benzene amine];
79. 4,4'-keto-bis-[(2-trifluoromethyl)benzene amine];
80. 9,9-bis(4-aminophenyl)fluorene;
81. 1,3-diamino-2,4,5,6-tetrafluorobenzene;
82. 3,3'-bis(trifluoromethyl)benzidine;
83. 4,4'-diaminobenzanilide,
84. o-tolidine sulfone;
85. o-tolidine disulfonic acid;
86. 4,4'-diamino-3,3'-dicarboxy-diphenyl methane];
87. 9,9-bis(4-aminophenyl)fluorene;
88. 1,3-bis(4-aminophenoxy)-2,2dimethylpropane;
89. diaminodurene;
90. 3,3',5,5'-tetramethylbenzidine;
91. a, w-bis(4-aminophenoxy)alkane;
92. 1,3-diamino-2,4,5,6-tetrafluorobenzene;
93. and the like.

Other possible diamines include divalent cycloaliphatic diamines, divalent aliphatic/aromatic diamines and divalent aromatic diamines comprising a siloxane group (e.g., diaminosiloxanes). As used herein, polysiloxane diamine is intended to mean a diamine having at least one polysiloxane moiety (e.g., shown in brackets in the formula below). For example, a useful polysiloxane diamine can have the general formula:

$NH_2—R_1—O—[SiR'R''—O—]_m—R_1—NH_2$ where R' and R'' are —(CH$_3$) or —(C$_6$H$_5$), where R$_1$ is —(CH$_2$)—$_n$ and where n is equal to about 1 to 10 (preferably about 3), and where m is 1 to 40 but can be 1 to 12, or can be 8-10. One common diaminosiloxane is 3,3'-(1,1,3,3,5,5-hexamethyl-1,5-trisiloxanediyl)-bis-1-propanamine.

A tetracarboxylic dianhydride can be used for the preparation of the polyimides (and polyamic acid precursors) of the present invention. These dianhydrides can generally be selected from a vast array of materials including cycloaliphatic tetracarboxylic dianhydrides, aliphatic tetracarboxylic dianhydrides, and/or aromatic tetracarboxylic dianhydrides. These dianhydrides may also be used in derivative forms such as diacid-diesters, diacid halide esters, and tetracarboxylic acids. In one instance, the use of aliphatic tetracarboxylic dianhydrides generally results in the formation of polyimides with excellent optical characteristics including transparency often though giving up thermal stability. Aromatic tetracarboxylic dianhydrides typically generate polyimides with excellent thermal characteristics such as heat resistance and thermal stability. Generally, the diamines of the present invention, used with traditional aromatic tetracarboxylic dianhydrides, can allow one to produce a polyimide showing improved thermal stability properties in conjunction with improved optical transparency making these polyimides useful in electronic device applications.

Examples of useful dianhydrides of the present invention include
1. pyromellitic dianhydride (PMDA);
2. 3,3',4,4'-biphenyl tetracarboxylic dianhydride (BPDA);
3. 3,3',4,4'-benzophenone tetracarboxylic dianhydride (BTDA);
4. 4,4'-oxydiphthalic anhydride (ODPA);
5. 3,3',4,4'-diphenylsulfone tetracarboxylic dianhydride (DSDA);
6. 4,4'-(4,4'-isopropylidenediphenoxy)bis(phthalic anhydride)(BPADA);
7. 2,3,6,7-naphthalene tetracarboxylic dianhydride;
8. 1,2,5,6-naphthalene tetracarboxylic dianhydride;
9. 1,4,5,8-naphthalene tetracarboxylic dianhydride;
10. 2,6-dichloronaphthalene-1,4,5,8-tetracarboxylic dianhydride;
11. 2,7-dichloronaphthalene-1,4,5,8-tetracarboxylic dianhydride;
12. 2,3,3',4'-biphenyl tetracarboxylic dianhydride;
13. 2,2',3,3'-biphenyl tetracarboxylic dianhydride;
14. 2,3,3',4'-benzophenone tetracarboxylic dianhydride;
15. 2,2',3,3'-benzophenone tetracarboxylic dianhydride;
16. 2,2-bis(3,4-dicarboxyphenyl)propane dianhydride;
17. 1,1-bis(2,3-dicarboxyphenyl)ethane dianhydride;
18. 1,1-bis(3,4-dicarboxyphenyl)ethane dianhydride;
19. bis(2,3-dicarboxyphenyl)methane dianhydride;
20. bis(3,4-dicarboxyphenyl)methane dianhydride;
21. 4,4'-(hexafluoroisopropylidene)diphthalic anhydride (6FDA);
22. bis(3,4-dicarboxyphenyl)sulfoxide dianhydride;
23. tetrahydrofuran-2,3,4,5-tetracarboxylic dianhydride;
24. pyrazine-2,3,5,6-tetracarboxylic dianhydride;
25. thiophene-2,3,4,5-tetracarboxylic dianhydride;
26. phenanthrene-1,8,9,10-tetracarboxylic dianhydride;
27. perylene-3,4,9,10-tetracarboxylic dianhydride;
28. bis-1,3-isobenzofurandione;
29. bis(3,4-dicarboxyphenyl)thioether dianhydride;
30. bicyclo[2.2.2]oct-7-ene-2,3,5,6-tetracarboxylicdianhydride;
31. 2-(3',4'-dicarboxyphenyl)5,6-dicarboxybenzimidazole dianhydride;
32. 2-(3',4'-dicarboxyphenyl)5,6-dicarboxybenzoxazole dianhydride;
33. 2-(3',4'-dicarboxyphenyl)5,6-dicarboxybenzothiazole dianhydride;
34. bis(3,4-dicarboxyphenyl)2,5-oxadiazole 1,3,4-dianhydride;
35. bis 2,5-(3',4'-dicarboxydiphenylether)1,3,4-oxadiazole dianhydride;
36. butane-1,2,3,4-tetracarboxylic dianhydride;
37. pentane-1,2,4,5-tetracarboxylic dianhydride;
38. cyclo butane tetracarboxylic dianhydride;
39. cyclo pentane-1,2,3,4-tetracarboxylic dianhydride;
40. cyclohexane-1,2,4,5 tetracarboxylic dianhydride;
41. cyclohexane-2,3,5,6-tetracarboxylic dianhydride;
42. 3-ethyl cyclohexane-3-(1,2)5,6-tetracarboxylic dianhydride;
43. 1-methyl-3-ethyl cyclohexane-3-(1,2)5,6-tetracarboxylic dianhydride;
44. 1-ethyl cyclohexane-1-(1,2),3,4-tetracarboxylic dianhydride;
45. 1-propylcyclohexane-1-(2,3),3,4-tetracarboxylic dianhydride;
46. 1,3-dipropylcyclohexane-1-(2,3),3-(2,3)-tetracarboxylic dianhydride;
47. dicyclohexyl-3,4,3',4'-tetracarboxylic dianhydride;
48. 4,4'-bisphenol A dianhydride;
49. 1,2,3,4-cyclobutanetetracarboxylic acid dianhydride; (−)-[1S*,5R*,6S*]-3-oxabicyclo[3.2.1]octane-2,4-dione-6-spiro-3-(tetrahydrofuran-2,5-dione) [i.e., (−)-DAN, manufactured by JSR Corp.];
50. bicyclo[2.2.2]oct-7-ene-2,3,5,6-tetracarboxylicdianhydride;
51. hydroquinonediphthalic anhydride;
52. ethyleneglycol bis(trimellitic anhydride);
53. and the like.

Other useful dianhydrides include 9,9-disubstituted xanthenes. These dianhydrides include, but are not limited to, 9,9-bis-(trifluoromethyl)xanthenetetracarboxylic dianhydride (6FCDA); 9-phenyl-9-(trifluoromethyl)xanthenetetracarboxylic dianhydride (3FCDA); 9,9-diphenyl-2,3,6,7-xanthenetetracarboxylic dianhydride (PPXDA); 9,9-diphenyl-2,3,6,7-tetramethylxanthene (TMPPX); 9,9-diphenyl-2,3,6,7-xanthenetetracarboxylic Bis(p-anisidylimide); 9,9-diphenyl-2,3,6,7-xanthenetetracarboxylic Bis(butylimide); 9,9-diphenyl-2,3,6,7-xanthenetetracarboxylic Bis(p-tolylimide); 9-phenyl-9-methyl-2,3,6,7-xanthenetetracarboxylic dianhydride (MPXDA); 9-phenyl-9-methyl-2,3,6,7-xanthenetetracarboxylic Bis(propylimide); 9-phenyl-9-methyl-2,3,6,7-xanthenetetracarboxylic Bis(p-tolyimide); 9,9-dimethyl-2,3,6,7-xanthenetetracarboxylic dianhydride (MMXDA); 9,9-dimethyl-2,3,6,7-xanthenetetracarboxylic Bis(propylimide); 9,9-dimethyl-2,3,6,7-xanthenetetracarboxylic Bis(tolylimide); 9-ethyl-9-methyl-2,3,6,7-xanthenetetracarboxlylic dianhydride (EMXDA);); 9,9-diethyl-2,3,6,7-xanthenetetracarboxylic dianhydride (EEXDA); etc. (as disclosed in Polyimides Based on 9,9-Disubstituted Xanthene Dianhydrides, Trofimenko and Auman, Macromolecules, 1994, vol. 27, p. 1136-1146, herein incorporated by reference).

The tetracarboxylic dianhydrides mentioned above can be used independently, depending on the purpose of the use, or can be used as mixture of two or more individual dianhydrides. Many of the above mentioned dianhydrides (if not all) can also be used in their 'tetra-acid form' (or as mono, di, tri, or tetra esters of the tetra acid), or as their diester acid halides (chlorides). In some embodiments of the present invention however, the dianhydride form is generally preferred because it is generally more reactive than the acid or the ester.

The polyimides of this invention, and their polyamic acid precursors, can be prepared using a polar organic solvent such as a phenolic solvent system or aprotic polar solvent system. For example, solvents or solvent mixtures based on phenol, phenol, 4-methoxy phenol, 2,6-dimethyl phenol, m-cresol (etc.) can be used. Alternatively aprotic solvents can also be used alone (or in combination with protic solvents). Some useful solvents include, but are not limited to, N-methylpyrrolidone (it is hereafter written as NMP), N,N-dimethylformamide (it is hereafter written as DMF), N,N-dimethylacetamide (it is hereafter written as DMAc), dimethyl sulfoxide (it is hereafter written as DMSO), gamma-butyrolactone, gamma-valerolactone and n-cyclohexyl pyrrolidone. Other useful solvents include, but are not limited, to chloroform, tetrahydrofuran (it is hereafter written as THF), cyclohexanone, dioxane, anisole, 2-methoxy ethanol, propylene glycol methyl ether, propylene glycol methyl ether acetate, "Cellosolve™" (ethylene glycol ethyl ether), butyl "Cellosolve™" (ethylene glycol butyl ether), "Cellosolve™ acetate" (ethylene glycol ethyl ether acetate), and "butyl Cellosolve™ acetate" (ethylene glycol butyl ether acetate), propylene glycol, monoethylether acetate, methylmethoxypropionate, lactic acid ethyl ester, and the like. The above described reaction solvents can be used independently or as mixtures.

Alternatively, the solvent systems described above can also be used in combination with aromatic hydrocarbon solvents, for example benzene, toluene xylene, or tetralin (these solvents being useful towards the removal of water generated during the imide conversion process). The manufacturing process for the polyimide resin starting from a diamine and a tetracarboxylic dianhydride may be carried out by well-known, conventional one-step polymerization methods in which the polymerization is carried out at high temperatures using an almost equal amount (in moles) of diamine and tetracarboxylic dianhydride. When using a one-step polymerization method, the preferred reaction temperature can be in the range of 120-350° C. or from about 150-300° C. Possible reaction times in a one step process can be from about 0.5 to 20 hours or from about 1 to 15 hours.

The making of the polyimide resins of the present invention can also be started by a two-step polymerization method. In the first step, a polyamic acid is synthesized at a low temperature. In the second step, the polyamic acid is converted to a polyimide at a higher temperature. When using a two-step polymerization method, the polyamic acid synthesis can be carried out at about −10° to 120° C. (or from about 15° to 100° C., or 20° to 80° C.) and the reaction time can be about from about 0.5 to 100 hours (or from about 1-100 hours). After which, the conversion of the polyamic acid to a polyimide can be carried out at a temperature of from about 120°-350° C. (or about 150°-300° C.) wherein the reaction time is about 0.5-20 hours (or about 1-10 hours).

If two or more different diamines (or different tetracarboxylic dianhydrides) are used, the polymer reaction method is typically not limited (i.e., various reaction methods may be utilized for the process). For example, one reaction method can be used to conduct the polymerization after mixing of all the starting materials, and such a method is particularly useful if a random polyimide resin is desired. In an alternative reaction method, two or more diamines or tetracarboxylic dianhydrides are added sequentially, where the monomers are added to the reaction vessel in a controlled fashion, and this method can be useful for preparing block or segmented polyimide resins.

In another embodiment if the polyimide backbone is soluble, a soluble polyimide resin solution can be obtained and can be used to form a soluble polyimide resin by removal of the solvent. A purified soluble polyimide resin can be obtained by using a precipitation method in which a poor solvent is used to precipitate the above-mentioned polyimides from the polyimide resin solution. This polyimide resin can be further purified and can later be used as a soluble polyimide after again dissolving the polyimide solution into an appropriate organic solvent (or mixture on having the desired polarity.

The polyimides of the present invention may be prepared using a variety of different methods with respect to how the components (i.e., the monomers and solvents) are introduced to one another. Numerous variations of producing a polyamic acid solution include:

(a) a method wherein the diamine components and dianhydride components are preliminarily mixed together and then the mixture is added in portions to a solvent while stirring.

(b) a method wherein a solvent is added to a stirring mixture of diamine and dianhydride components (contrary to (a) above).

(c) a method wherein diamines are exclusively dissolved in a solvent and then dianhydrides are added thereto at such a ratio as allowing to control the reaction rate.

(d) a method wherein the dianhydride components are exclusively dissolved in a solvent and then amine components are added thereto at such a ratio to allow control of the reaction rate.

(e) a method wherein the diamine components and the dianhydride components are separately dissolved in solvents and then these solutions are mixed in a reactor.

(f) a method wherein the polyamic acid with excessive amine component and another polyamic acid with excessive dianhydride component are preliminarily formed and then reacted with each other in a reactor, particularly in such a way as to create a non-random or block copolymer.

(g) a method wherein a specific portion of the amine components and the dianhydride components are first reacted and then the residual diamine components are reacted, or vice versa.

(h) a method wherein the components are added in part or in whole in any order to either part or whole of the solvent, also where part or all of any component can be added as a solution in part or all of the solvent.

(i) a method of first reacting one of the dianhydride components with one of the diamine components giving a first polyamic acid. Then reacting the other dianhydride component with the other amine component to give a second polyamic acid. Then combining the amic acids in any one of a number of ways prior to film formation.

Generally speaking, a polyamic acid casting solution can be derived from any one of the polyamic acid solution preparation methods disclosed above.

The polyamic acid casting solutions of the present invention comprises both a polyamic acid solution combined with some amount of conversion chemicals. The conversion chemicals found to be useful in the present invention include, but are not limited to, (i) one or more dehydrating agents, such as, aliphatic acid anhydrides (acetic anhydride, etc.) and aromatic acid anhydrides; and (ii) one or more catalysts, such as, aliphatic tertiary amines (triethylamine, etc.), aromatic tertiary amines (dimethylaniline, etc.) and heterocyclic tertiary amines (pyridine, picoline, isoquinoilne, etc.). The anhydride dehydrating material is typically used in a slight molar excess of the amount of amide acid groups present in the polyamic acid solution. The amount of acetic anhydride used is typically about 2.0-3.0 moles per equivalent of the polyamic acid. Generally, a comparable amount of tertiary amine catalyst is used. Alternatively, a thermal conversion process can be used, i.e., a process that employs only heat to cure the polyimide from its polyamic acid precursor state.

During the conversion to a polyimide, water is typically generated due to the 'ring-closure' of the polyamic acid precursor material. The water may be removed during the process to promote further conversion of the acid to the imide. Water removal may be accomplished by azeotropic distillation with benzene, toluene, xylene, tetralin, or other suitable agent with the objective of removing the water from the reaction system. Alternatively, a dehydration agent may be utilized (such as anhydrous acetic acid or molecular sieves) to accelerate the conversion rate of the polyamic acid to a polyimide. Optionally, an imidization catalyst may be added to the reaction mixture. Typical basic imidization catalyst useful in the present invention include for example, N,N-dimethylaniline, N,N-diethylaniline, pyridine, quinoline, isoquinoline, α-picoline, β-picoline, γ-picoline, 2,4-lutidine, triethylamine, tributylamine, tripentylamine, N-methylmorpholine, etc. Other typical imidization include benzoic acid, o-hydroxybenzoic acid, m-hydroxybenzoic acid, p-hydroxybenzoic acid, 2,4-dihydroxybenzoic acid, p-hydroxyphenyl acetic acid, 4-hydroxyphenylpropylene acid, phosphoric acid, p-phenol sulfone acid, p-toluene sulfone acid, crotonic acid etc. The loading level of the above-described imidization catalysts should be in the range of 1-50 mol %, or 5-35 mol %, with respect to the diamine or the mixture of diamines. Using these condensation polymerization catalysts, the polymerization reaction may be carried out at a lower temperature. This protocol might be of advantage if coloration is avoided and if the reaction time is reduced in the process.

In one embodiment of the present invention a polyimide film is formed having a thickness of between (and including) any two of the following numbers, 2, 5, 10, 15, 20, 25, 30, 35, 40, 50, 60, 70, 80, 90, 100, 150, 200, 250 and 300 microns. Typically, the polyimides of the present invention can have a glass transition temperature of about 250° C., especially when derived from BPDA as the dianhydride component. In many cases the polyimides of the present invention have a glass transition temperature between any two of the following numbers, 200, 220, 240, 260, 280, 300, 320 and 360° C.

In one embodiment of the present invention, a polyimide is formed having a glass transition temperature between and including any two of the following numbers, 550, 530, 510, 490, 470, 450, 430, 410, 390, 370, 350, 330, 310, 290, 270, 250, 220, 200, 150 and 100° C.

In one embodiment of the present invention, fillers can be added to the polyimide formulation to form a polyimide composite. Some fillers include, but are not limited to, aluminum oxide, silica, boron nitride, boron nitride coated aluminum oxide, granular alumina, granular silica, fumed silica, silicon carbide, aluminum nitride, aluminum oxide coated aluminum nitride, titanium dioxide, dicalcium phosphate, barium titanate, barium strontium titanate (BST), lead zirconate titanate (PZT), lead lanthanum titanate, lead lanthanum zirconate titanate (PLZT), lead magnesium niobate (PMN), and calcium copper titanate, carbon powder and titanium dioxide, indium oxide, tin oxide, zinc oxide, cadmium oxide, gallium oxide silicon carbide, diamond, dicalcium phosphate, polyaniline, polythiophene, polypyrrole, polyphenylenevinylene, polydialkylfluorenes, and electrically conductive polymers and combinations thereof. In one embodiment, nano-sized filler in accordance with the present invention (i.e., alumina oxide particles) are first dispersed in a solvent to form a slurry. The slurry is then dispersed in the polyamic acid precursor solution. This mixture is referred to herein as a filled polyamic acid casting solution. The concentration of filler to polyimide (in the final composite film) is typically in the range of 40, 45, 50, 55, 60, 65, 70, 75, 80 or 85(%) percent by weight. As the concentration of the filler increases, the thermal conductivity of the composite polyimide also increases. Here a filler can be present in a concentration range from about 1, 3, 5, 7, 9 or 10 weight (%) percent to about 15, 20, 25, 30, 35, 40, 45 or 50(%) weight percent or greater and can generally have an average particle size (in the polyimide binder matrix) in a range between and including any two of the following sizes: 100, 125, 150, 175, 200, 250, 300, 350, 400, 450, 500, 1000, 2000, 3000, 4000, and 5000 nanometers, where at least 80, 85, 90, 92, 94, 95, 96, 98, 99 or 100 weight-percent of the dispersed filler is within the above defined size range(s)

It would be impossible to discuss or describe all possible polyimide-metal laminate manufacturing processes useful in the practice of the present invention. It should be appreciated that the monomer systems of the present invention are capable of providing the above-described advantageous properties in a variety of manufacturing processes. The compositions of the present invention can be manufactured as described herein and can be readily manufactured in any one of many (perhaps countless) ways of those of ordinarily skilled in the art, using any conventional or non-conventional polyimide (and multi-layer) manufacturing technology.

A conductive layer (typically a metal) can be formed on the polyimides of the present invention by:
  i. metal sputtering (optionally, then electroplating);
  ii. foil lamination; and/or
  iii. any conventional or non-conventional method for applying a thin metallic layer to a substrate.

A conductive layer as used herein can be a metal selected from the group consisting of copper, steel (including stainless steel), aluminum, brass, a copper alloy, a metal alloy derived from copper and molybdenum, Kovar®, Invar®, a bimetal, a trimetal, a trimetal derived from two-layers of copper and one layer of Invar®, and a trimetal derived from two layers of copper and one layer of molybdenum.

In one embodiment of the present invention, the high $T_g$ polyimide layer is placed between a conductive layer. Optionally, a low $T_g$ polyimide layer can be used to bond together the metal and the high Tg layer. The high Tg layer is typically used to improve structural integrity and/or improved stability of the laminate to environmental changes, such as heat and humidity. An electronic circuit (defined by, connected to, or otherwise integrated with the metal layer) can show improved low (signal) loss in high-speed digital applications.

In another embodiment of the present invention, a low $T_g$ polyimide layer is placed between a conductive layer and a high $T_g$ polyimide layer, and a second low $T_g$ polyimide layer is placed on the opposite side of the high $T_g$ polyimide. One advantage of this type of construction is that the lamination temperature of the multi-layer substrate is lowered to the lamination temperature necessary for the low $T_g$ polyimide layer to bond. In one embodiment, the low Tg and high Tg layers are cast simultaneously as one polyamic acid film and then cured to form a three-layer polyimide. In yet another embodiment, a high Tg layer is bonded to a metal using an adhesive made from an epoxy, cyanate, urethane, melamine, acrylic, phenolic, phenolic butyral, imide or a combination thereof.

In one embodiment of the present invention, the polyimides disclosed herein can be used to form a polyimide fiber. In addition, the polyimides herein can be used to form a molded part. These polyimides can be extruded to form gaskets, rings, diaphragms, mechanical parts and components, wire coatings, and the like.

In one embodiment of the present invention a polyimide is formed having the formula represented below;

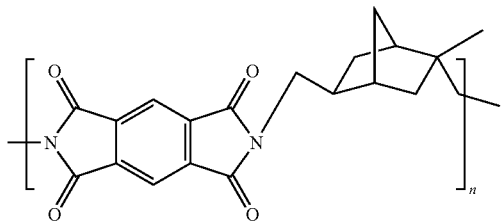

(VI)

The polyimide shown in formula (VI) is typically formed from a mixture of isomeric diamines based on the mixtures (and isomers) described above. Another common polyimide of the present invention can be shown by the following formula below,

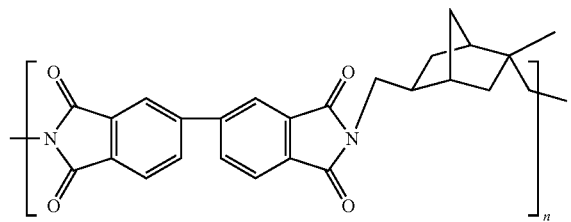

(VII)

The polyimide films of the present invention can show excellent light transparency as well as high Tg. These two properties together can allow the polyimide film to be useful in making a flexible substrate material in an organic light emitting diode (OLED) display or a liquid crystal display (LCD). These polyimides can also be useful in other electronic applications such as a coating material for electronic parts (such as IC's). Other useful applications include, but are not limited to optoelectronic materials (such as liquid crystal-based membranes), color filter blanket films, electronic switches for optical response systems, integrated circuit chip stress buffers, interlayer dielectrics, or as a material for an optical fiber.

In another embodiment of the present invention, when the diamines of formula (I) are used in combination with other diamines disclosed in a general list, other physical properties of the polyimide can be improved. One physical property in particular important to many applications is adhesion. This property can be improved especially when the diamine substitute in is a diaminosiloxane. The polyimides of the present invention, derived in part from diaminosiloxane, can be dissolved in low boiling point solvents such as cyclohexanone, dioxane, and lactic acid ethyl ester. This can allow one to form polyimide film having good adhesion to a silicon wafer (i.e., generally without having to sacrifice light transparency and thermal stability) as well as maintaining a relatively low range of processing temperatures.

Although the following examples explain this invention in detail, the range of this invention is not limited by these examples.

EXAMPLES

In the following EXAMPLES, measurements of a variety of physical properties were recorded. For glass transitional temperatures, a differential scanning calorimetry (DSC) method was used using a TA Instruments 2910 DSC. A 5 to 10 mg of sample was placed in the non-hermetic sample pan. The test was performed under 50 ml/min $N_2$ flow from ambient temperature to 400° C. at 10° C./min rate. For light transmittance (T %), the transmittance data was obtained with a Cary 500 UV/VIS/NIR spectrometer from Varian. The spectrum of 200 nm to about 700 nm was collected under air background. The coefficient of thermal expansion (CTE) of these samples was analyzed using a thermal mechanical analyzer (TMA). The device is capable of reading the dimensional change of a film sample as it is heated. During the test, the film was held at a constant load of about 0.05 N. The CTE for each film sample was determined by performing a linear regression of the data obtained in the temperature range of about 50° C. to 250° C. Film thickness at the measurement point was about 3.3 to about 4.3 mils and calculated on a 4.0 mil basis (or about 100 microns).

Example 1

In a 250-ml two-neck flask with $N_2$ blanket, 38.88 g of pyromellitic dianhydride (PMDA) was dissolved in 120 ml DMAc with mechanical stirring. Then, 30.0 g of 2,5-(or 6)-bis(aminomethyl)-2-methyl-bicyclo[2.2.1]heptane (k=0, i.e. diamine represented by structure (I) above, being mixture of formula IV and V) was mixed with 40 ml DMAc and then added into the flask dropwise over 3 hrs. while maintain the reaction mixture at about 0° C. The solution was allowed to polymerize into a viscous polymer.

The reaction mixture was maintained at room temperature overnight. Precipitation was initially observed, but the precipitate gradually dissolved with agitation. The mixture eventually became a clear, viscous liquid.

The reaction mixture was then heated to 35° C. for about 72 hrs. At this temperature, most if not all of any precipitate was completely dissolved. A portion of the reaction solution was cast on a 5"×7" glass slides using a 10-mil thick blade. The glass slides, with the polymer films, were kept under vacuum and room temperature for about 3 hrs. From these slides, polyimide films were prepared.

Additional polymer reaction mixture was added into acetone. The resultant precipitated polymer (polyamic acid) was filtered and then dried at room temperature over night under vacuum. A portion of the polyamic acid was coated onto a 5"×7" glass slide. From this, a polyimide film was formed by putting the vacuum treated polymer (PAA) film (on a glass slide) into an oven (purged with $N_2$) at a temperature profile of 60° C. (1 hr), 100° C. (1 hr), and 200° C. (1 hrs). DMAC and water were purged from the oven using a continuous $N_2$ feed.

After cooling to about 50° C., the polyimide film was taken out of the oven, and then separated from the glass substrate by immersing the glass substrate (with film) into boiling water. The separated polyimide film was put into a vacuum oven at 300° C. and further cured for about 1 hr. under vacuum. Film properties are shown in Table 1 below.

Example 2

In a 50-ml three-neck flask with $N_2$ blanket, 9.8 g of pyromellitic dianhydride (PMDA) was dissolved in 35 ml of DMAc using a magnetic stirrer. Next, 10.5 g of 2,5 (or 6)-bis(aminomethyl)-2-methyl-bicyclo[2.2.1]heptane (i.e. k=1) was added with dilution using an additional 10 ml of DMAc. The polymerization reaction was maintained at 0° C. for about 1 hour. Precipitation was observed. The mixture was kept at room temperature overnight. Subsequently, the reaction mixture was kept at 60° C. for about 72 hrs. A portion of reaction solution was cast onto a 5×7-cm glass slide and kept under vacuum, and at room temperature, for about 3 hrs. This release trapped bubbles.

Next, the cast polymer was converted to a polyimide film. The temperature for this conversion was adjusted per the following, 60° C. (1 hr), 100° C. (1 hr), 200° C. (1 hrs). As a result of this conversion, most of the DMAc and water was purged from the film under continuous $N_2$ feed. After cooling of the film (down to about 50° C.), the film substrate was taken out of the oven. The polyimide film was separated from the glass substrate by immersing the glass substrate (and film) into boiling water. The separated polyimide film was put into a vacuum oven, set at 300° C., and further cured for 1 hr. Film properties are shown in Table 1 below.

Example 3

In a 250-ml two-neck flask with $N_2$ blanket, 43.7 g of 3,3',4,4'-biphenytetracarboxylic dianhydride (BPDA) was dissolved in 120 ml DMAc with magnetic stirring. Next, 25.0 g of 2,5-(or 6)-bis(aminomethyl)-2-methyl-bicyclo[2.2.1]heptane (i.e., k=0) was dissolved in 40 ml DMAc and was added into the flask via an additional funnel drop by drop over 3 hrs while maintaining the entire flask ~0° C. A mechanical stirrer was used. After all diamine/DMAc was added, the entire mixture became highly viscous with off-white color. The reaction was maintained at 30° C. overnight. The large lump was dissolved overnight and the entire mixture became viscous clear liquid with some light yellowish color. Little undissolved solid was observed. Then the reaction was kept at 35° C. for 72 hours (or until practically all of the precipitate was dissolved). The reaction mixture remained transparent and relatively homogeneous having a light yellowish color.

A portion of the reaction solution was cast onto a 5"×7" glass slide using a 10-mil blade. The cast polymer was kept under vacuum and at room temperature for about 3 hours to remove trapped bubbles.

The cast polyamic acid film was converted to a polyimide film by putting the pre-vacuumed polymer into an oven purged with $N_2$. The temperature was set at 60° C. (1 hr), 100° C. (1 hr) and 200° C. (1 hr). Excess DMAc and water were purged from the oven using a continuous feed stream of $N_2$.

After cooling to ~50° C., the film substrate on glass was taken out of the oven. The polyimide film was separated from the glass substrate by immersing the glass (and film) into boiling water. The freed polyimide film was put into a vacuum oven at a temperature of 300° C. and cured for about 1 hour under vacuum. The final polyimide obtained had good mechanical integrity and had a light yellowish color. Film properties are shown in Table 1 below.

Comparative Example 1

In a 250-ml two-neck flask with N2 blanket, 41.44 g of pyromellitic dianhydride (PMDA) was dissolved in 120 ml DMAc with mechanical stirring. Next, 29.31 g of norbornane diamine (NBDA diamine made by Mitsui Chemicals Inc., a mixture of diamines comprising 2,5-NBDA and 2,6-NBDA, IUPAC name being 2,5(and 6)-Bis(aminomethyl)bicyclo [2.2.1]heptane) was diluted into 40 ml of DMAC. The diamine solution was then added to the dianhydride solution via a funnel drop by drop over 3 hours while maintaining the temperature at about 0° C.

After all of the diamine solution was added the mixture became viscous and had a pink hue. The polymerization reaction was maintained at room temperature overnight. Some precipitation was observed and was allowed to dissolve overnight. The mixture became a viscous, clear liquid having a yellowish tint. Next, the polymer was aged at 35° C. for 72 hour until all of the precipitation was dissolved.

A portion of polymer was cast onto a 5"×7" glass slide using a 10-mil blade. The casting was kept under vacuum and at room temperature for about 3 hours to remove trapped bubbles.

A polyimide film was formed by putting the pre-vacuumed cast polymer (a polyamic acid) into an oven (purged with N2) and set at a temperature of about 60° C. (for 1 hr.), at 100° C. (for 1 hr.), and 200° C. (for about 1 hour). DMAc and water were purged out of oven using a continuous feed stream of nitrogen.

After cooling down to about 50° C., the substrate was taken out of the oven and was separated from the glass substrate by immersing the glass substrate (and the film) into boiling water.

The polyimide film was put into a vacuum oven at 300° C. and thermally cured for 1 hour. The final polyimide obtained had a yellowish color and had good physical integrity. Film properties are shown in Table 1 below.

TABLE 1

| PI FILM PROPERTY | EXAMPLE 1 | EXAMPLE 2 | EXAMPLE 3 | COMP. EX. 1 |
|---|---|---|---|---|
| Light Trans. % (400~700 nm) | 85.4 | 49.5 | 84.1 | 45.0 |
| CTE (ppm/° C.) | 51.9 | 58.8 | 51.9 | 61.0 |
| Tg (DMA) | 355.6° C. | 326.1° C. | 255.5° C. | 324.2° C. |

What is claimed is:

1. A polyimide composition derived from a diamine component and a dianhydride component wherein the diamine component comprises from 3 to 25 mole percent of a diamine represented by the following formula,

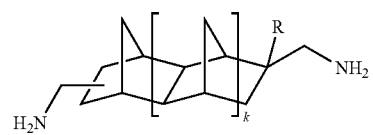

where R is —$CH_3$, —$CH_2$—$CH_3$, —$CH_2$—$CH_2$—$CH_3$, —$(CH_2)_3$—$CH_3$, —$(CH_2)_4$—$CH_3$, —$CX_3$, —$CH_2$—$CX_3$, —$CH_2$—$CH_2$—$CX_3$, —$(CH_2)_3$—$CX_3$, —$(CH_2)_4$—$CX_3$ where X is equal to F, Cl, or Br, —$C_6H_5$ and ortho or para $C_6H_5$—$CH_3$ wherein k is either 1 or 2, wherein the diamine component comprises from between 75 and 97 mole percent of a diamine represented by the following formula,

NH$_2$—X$_1$—NH$_2$ wherein X$_1$ stands for a divalent aliphatic group, a divalent aromatic group, or a divalent siloxane containing aliphatic or aromatic group, and wherein the dianhydride component is selected from the group consisting of a dianhydride, a diacid-diester, a diacid halide ester, or a tetra-carboxylic acid.

2. A composition in accordance with claim 1 wherein the polyimide component has a glass transition temperature between and including 550 and 330° C.

* * * * *

UNITED STATES PATENT AND TRADEMARK OFFICE
CERTIFICATE OF CORRECTION

PATENT NO. : 7,572,878 B2  Page 1 of 1
APPLICATION NO. : 11/229110
DATED : August 11, 2009
INVENTOR(S) : Ding et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 917 days.

Signed and Sealed this

Seventh Day of September, 2010

David J. Kappos
*Director of the United States Patent and Trademark Office*